(12) United States Patent
Janssens et al.

(10) Patent No.: US 11,655,535 B2
(45) Date of Patent: May 23, 2023

(54) DEVICE FOR PULSED LASER DEPOSITION AND A SUBSTRATE WITH A SUBSTRATE SURFACE FOR REDUCTION OF PARTICLES ON THE SUBSTRATE

(71) Applicant: LAM RESEARCH CORPORATION, Fremont, CA (US)

(72) Inventors: Jan Arnaud Janssens, Schalkhaar (NL); Jan Matthijn Dekkers, Aadorp (NL); Kristiaan Hendrikus Aloysius Böhm, Deventer (NL); Willem Cornelis Lambert Hopman, Deventer (NL); Jeroen Aaldert Heuver, Enschede (NL)

(73) Assignee: LAM RESEARCH CORPORATION, Fremont, CA (US)

( * ) Notice: Subject to any disclaimer, the term of this patent is extended or adjusted under 35 U.S.C. 154(b) by 104 days.

(21) Appl. No.: 16/451,282

(22) Filed: Jun. 25, 2019

(65) Prior Publication Data
US 2020/0002805 A1 Jan. 2, 2020

(30) Foreign Application Priority Data
Jun. 28, 2018 (EP) .................................... 18180369

(51) Int. Cl.
*C23C 14/28* (2006.01)
*H01J 37/32* (2006.01)

(52) U.S. Cl.
CPC ........ *C23C 14/28* (2013.01); *H01J 37/32339* (2013.01); *H01J 37/32449* (2013.01)

(58) Field of Classification Search
None
See application file for complete search history.

(56) References Cited

U.S. PATENT DOCUMENTS

| 5,126,165 A | 6/1992 | Akihama et al. |
| 5,411,772 A * | 5/1995 | Cheung .................. C23C 14/28 427/561 |

(Continued)

FOREIGN PATENT DOCUMENTS

| EP | 2410074 A1 | 1/2012 |
| JP | 2001192811 A | 7/2001 |
| WO | 2012010359 A1 | 1/2012 |

OTHER PUBLICATIONS

China National Intellectual Property Administration, Office Action and Search Report Issued in Application No. 201910570727.6, dated Sep. 28, 2022, 15 pages.

(Continued)

*Primary Examiner* — Keath T Chen
(74) *Attorney, Agent, or Firm* — Alleman Hall Creasman & Tuttle LLP

(57) ABSTRACT

The invention relates to a device for pulsed laser deposition and a substrate with a substrate surface, which device includes: a substrate holder for holding the substrate; a target arranged facing the substrate surface of the substrate; a velocity filter arranged between the substrate and the target; a pulsed laser directed onto the target at a target spot for generating a plasma plume of target material; and a plasma hole plate arranged between the target and the substrate. The plasma hole plate has a plasma passage opening divided in an upstream section and a downstream section by a dividing plane. The target spot coincides with the dividing plane, and the surface area of the upstream section is larger than the surface area of the downstream section.

12 Claims, 3 Drawing Sheets

(56) References Cited

U.S. PATENT DOCUMENTS

| | | | |
|---|---|---|---|
| 2004/0013820 A1 | 1/2004 | Cadieu | |
| 2010/0196624 A1* | 8/2010 | Ruuttu | B23K 26/067 |
| | | | 118/620 |
| 2012/0122317 A1* | 5/2012 | Broekmaat | B23K 26/0861 |
| | | | 438/758 |
| 2012/0244032 A1* | 9/2012 | Lappalainen | C30B 23/02 |
| | | | 420/433 |
| 2013/0340680 A1 | 12/2013 | Sonoda et al. | |
| 2015/0255757 A1 | 9/2015 | Dekkers et al. | |
| 2017/0350000 A1* | 12/2017 | Kekkonen | B23K 26/361 |

OTHER PUBLICATIONS

Taiwan Intellectual Property Office, Office Action and Search Report Issued in Application No. 108120581, dated Sep. 30, 2022, 11 pages.

Nguyen, M. et al., "Film-thickness and composition dependence of epitaxial thin-film PZT-based mass-sensors," Sensors and Actuators A: Physical, vol. 199, Sep. 1, 2013, 9 pages.

* cited by examiner

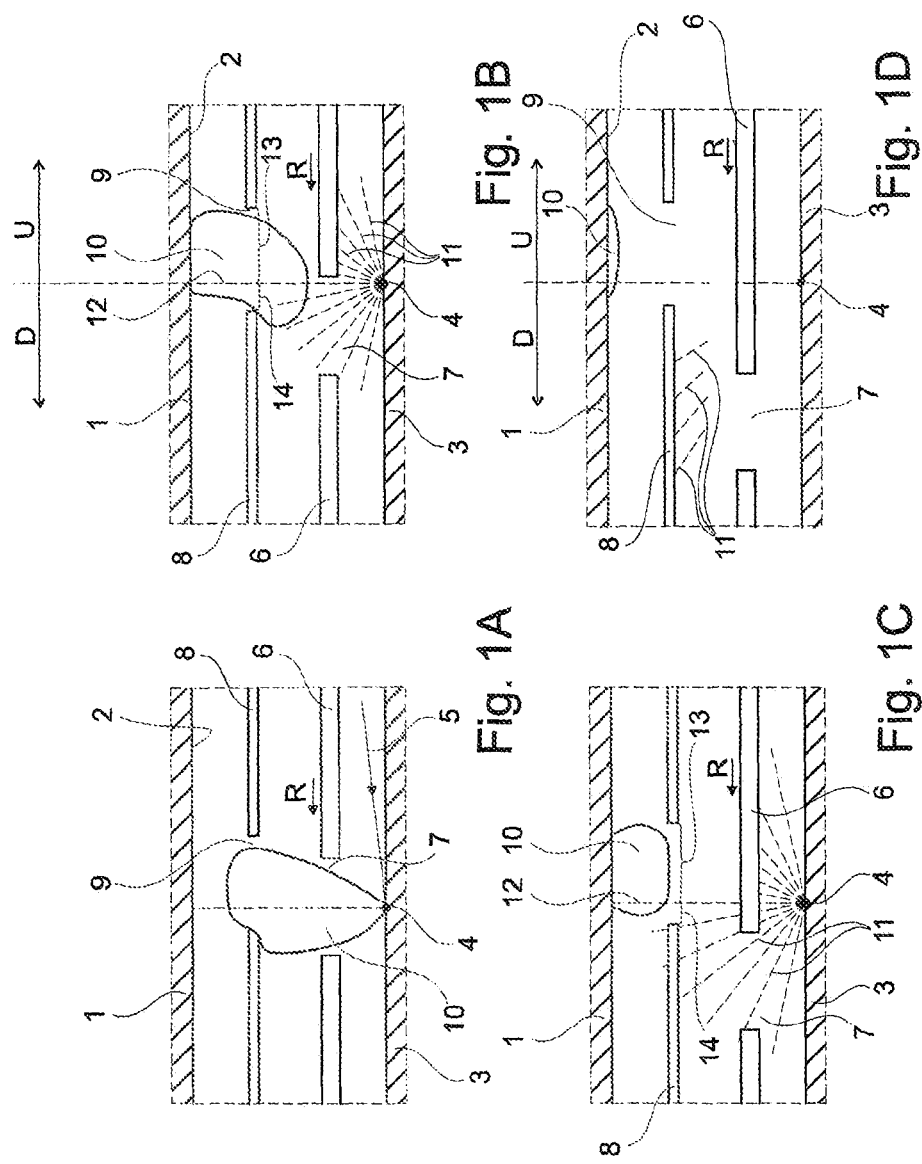

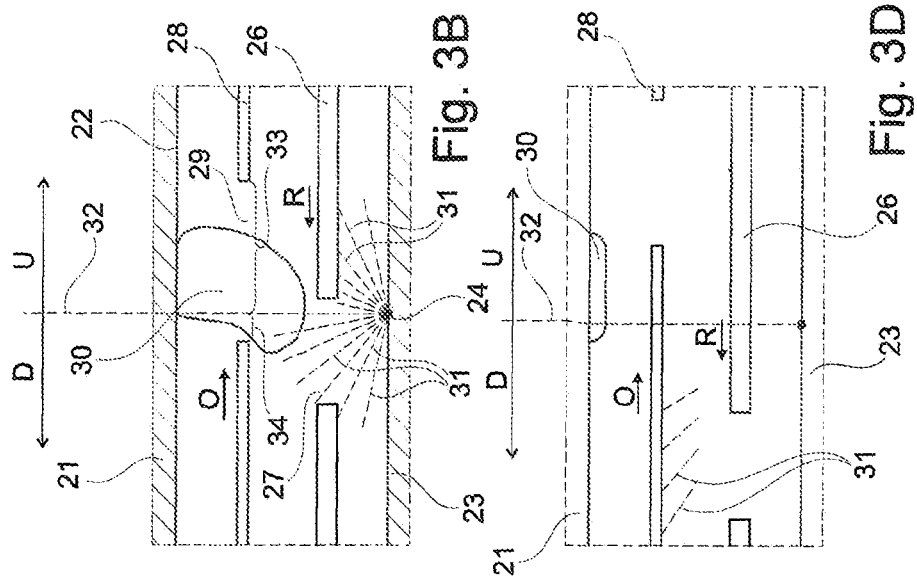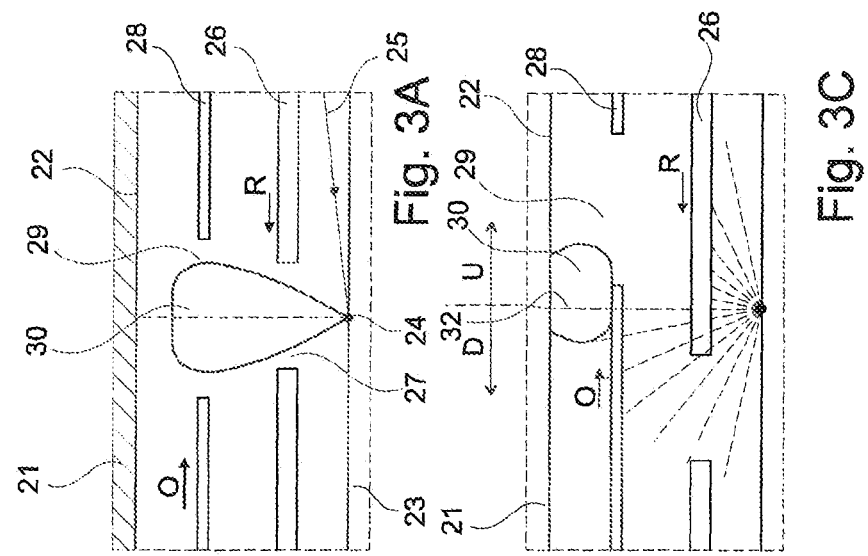

DEVICE FOR PULSED LASER DEPOSITION AND A SUBSTRATE WITH A SUBSTRATE SURFACE FOR REDUCTION OF PARTICLES ON THE SUBSTRATE

CROSS-REFERENCE TO RELATED APPLICATION

This application claims priority to European Patent Application No. 18180369.3 filed Jun. 28, 2018, the disclosure of which is hereby incorporated by reference in its entirety.

BACKGROUND OF THE INVENTION

Field of the Invention

The invention relates to a device for pulsed laser deposition and a substrate with a substrate surface, which device comprises:
a substrate holder for holding the substrate;
a target arranged facing the substrate surface of the substrate;
a velocity filter arranged between the substrate and the target, which velocity filter comprises a rotating body with at least one filter passage opening; and
a pulsed laser directed onto the target at a target spot for generating a plasma plume of target material, wherein the surface of the target at the target spot faces the substrate surface.

Technical Considerations

Such a device is for example known from EP 2410074. In this publication a device for pulsed laser deposition (PLD) is shown, wherein a velocity filter is arranged between the target and the substrate to wipe particles trailing the plasma plume by catching these particles on one of the blades of the rotating velocity filter.

If a target is hit at a target spot by a pulsed laser beam, a part of the target material will evaporate and a plasma plume of target material is generated. This plasma plume has an elongate shape with a main direction perpendicular to the surface of the target at the target spot. Apart from the generated plasma plume, also particles can be generated during the PLD process, such as particles breaking loose from the target, and these particles will scatter in any direction. The target spot can be considered a point source for these particles.

With the device according to EP 2410074, the velocity filter tries to catch as much of these scattered particles as possible. However, particles having a directional component in the same direction as the direction of rotation of the velocity filter will have a relative longer time to pass the velocity filter between the blades of the filter, than particles having a directional component in the opposite direction as the direction of rotation of the velocity filter. As a result, the velocity filter will still let pass a certain amount of particles, which will negatively influence the quality of the deposition on the substrate.

It is an object of the invention to reduce or even remove the above mentioned disadvantages.

SUMMARY OF THE INVENTION

This object is achieved with a device according to the preamble, which device is characterized by a plasma hole plate arranged between the target and the substrate, which plasma hole plate has a plasma passage opening, wherein the plasma passage opening is divided in an upstream section and a downstream section by a dividing plane, which is perpendicular to the direction of rotation of the velocity filter, wherein the target spot coincides with the dividing plane, and wherein the surface area of the upstream section is larger than the surface area of the downstream section.

It should according to the invention be understood, that the downstream section is located, seen in direction of rotation of the velocity filter, beyond the upstream section.

The plasma hole plate provides a basic filtering of particles as particles can only pass the plasma hole plate via the plasma passage opening and will be blocked/filtered by the plate itself.

Because the target spot can be considered a point source for the particles, the particles with a directional component in the same direction as the direction of rotation of the velocity filter will be directed towards the downstream section of the plasma passage opening, whereas the particles with a directional component opposite the direction of rotation will be directed towards the upstream section.

The particles directed towards the upstream section will encounter the velocity filter sooner due to the direction of rotation, than the particles directed to the downstream section. The particles directed to the downstream section have a relative longer period of time to pass the velocity filter. So, more particles directed towards the upstream section will be filtered by the velocity filter, than the particles directed towards the downstream section.

In order to compensate for this difference the plasma passage opening is larger at the upstream side than on the downstream side, such that on the downstream side the plasma hole plate contributes more to the filtering of the particles.

Because the downstream section of the plasma passage hole has a smaller surface area, also part of the plasma plume could be blocked by the plasma hole plate. This will reduce the deposition rate at the substrate, but the advantage of the substantially increased filtering of the plasma hole plate and the velocity filter outweighs this disadvantage.

It should be noted that although the plasma passage opening has an upstream section with a larger surface area than the downstream section, the shape of the plasma passage opening can still be symmetrical. In such a case the center of the symmetrical plasma passage opening will be offset relative to the target spot when viewed in a direction perpendicular to the surface of the target spot.

In a preferred embodiment of the device according to the invention the length of the upstream section of the plasma passage opening in the direction of rotation of the velocity filter is larger than the length of the downstream section of the plasma passage opening in the direction of rotation of the velocity filter.

In a further preferred embodiment of the device according to the invention the plasma hole plate is arranged between the velocity filter and the substrate.

The undesired particles are in this embodiment first filtered by the velocity filter, while any passing particles can be further filtered by the plasma hole plate.

In another embodiment of the device according to the invention, in use, a part of the generated plasma plume is shielded by the plasma hole plate on the downstream section side of the dividing plane. Although the size of the downstream section can be chosen such that a part of the generated plasma plume is shielded and the deposition rate is reduced, this outweighs the quality of the deposited target material, due to the increased filtering action of the plasma hole plate.

Preferably, in use, a larger part of the generated plasma plume is shielded on the downstream section side of the dividing plane than on the upstream section side of the dividing plane. In this embodiment, the shape and size of the plasma passage opening contributes to the filtering of particles, but also contributes to shaping of the plasma plume, which could have a positive effect on the deposited layer of target material.

In yet another embodiment of the device according to the invention the plasma hole plate rotates in opposite direction compared to the direction of rotation of the velocity filter.

By rotating the plasma hole plate and accordingly the plasma passage opening, the dynamic effect is that the surface area of the upstream section is larger than the surface area of the downstream section. So, when the plasma plume passes the plasma passage opening, the passage opening is moving, such that the surface area of the downstream section is smaller than the surface area of the upstream section. As a result particles trailing the plasma plume still passing the velocity filter will be caught by the plasma hole plate.

By using the dynamic effect, it is possible to have a symmetrical plasma passage opening. Also with a stationary plasma hole plate, it is possible to use a symmetrical shaped plasma passage opening by having the dividing plane extending off-center from the plasma passage opening.

With a stationary plasma hole plate it is however preferred that the plasma passage opening is asymmetrically shaped in relation to the radial direction of the plasma hole plate.

In a further embodiment, a flange can be arranged on the edge of the plasma passage opening, which flange extends towards the target and is arranged at least in the upstream section.

The plasma plume expands depending on the pressure in the chamber in which the PLD process is performed. The flange can be shaped to correspond to the shape of the plasma plume to allow the plasma plume a free passage through the plasma passage opening, while the flange can provide a shield for the undesired particles, which are emitted from the target spot in random direction.

Furthermore, although it is preferred to have the surface of the target at the target spot parallel to the substrate surface, providing an angle between the surface of the target spot and the substrate surface larger than 0° can contribute to the filtering action, as the plasma plume will always leave the target spot surface perpendicularly, while the undesired particles will leave the target spot surface at any direction.

BRIEF DESCRIPTION OF THE DRAWINGS

These and other features of the invention will be elucidated in conjunction with the accompanying drawings.

FIGS. 1A-1D show a schematic cross-sectional view of a first embodiment of a device according to the invention in four different positions.

FIGS. 3A-3D show a schematic cross-sectional view of a second embodiment of a device according to the invention in four different positions.

DESCRIPTION OF THE INVENTION

Figure 2A:
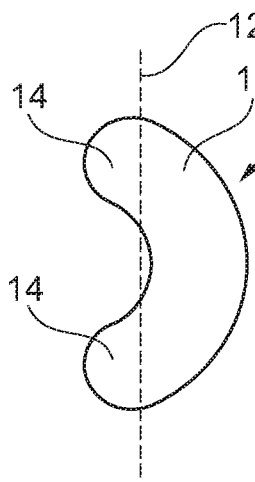
FIGS. 2A-2I show different shapes for the plasma passage opening.
Figure 2B:
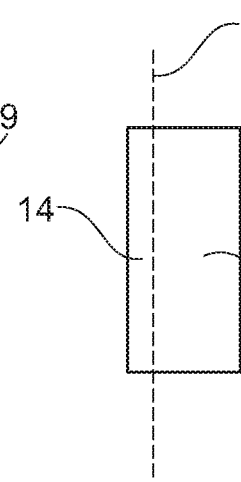
Figure 2C:
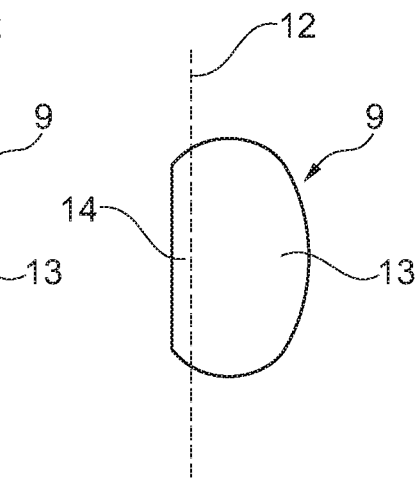

FIG. 1A shows a substrate 1 with a substrate surface 2. The substrate 1 is typically arranged in a substrate holder (not shown). A target 3 is arranged facing the substrate surface 2. The target 3 has a target spot 4 on which a laser beam 5 is directed. Typically the laser beam 5 is moved over the target and the substrate 1 is moved, for example rotated, such that a larger area of the substrate surface 2 can be treated.

A velocity filter 6, which is a disc with a filter passage opening 7, rotates between the substrate 1 and the target 3. Furthermore a plasma hole plate 8 with a plasma passage opening 9 is arranged between the velocity filter 6 and the substrate 1. The plasma passage opening 9 is arranged stationary relative to the target spot 4. So, if the laser beam 5 is moved over the target 3 to treat a larger surface of the substrate 1, then the plasma passage opening 9 moves along with the target spot 4.

The pulsed laser 5 is fired at the target spot 4 when the filter passage opening 7 is positioned over the target spot 4 and the generated plasma plume 10 can freely pass the velocity filter 6 through the filter passage opening 7 (See FIG. 1A).

After the laser beam 5 has been fired, the plasma plume 10 will move towards the substrate surface 2 via the filter passage opening 7 and the plasma passage opening 9.

Also particles 11 will start to be expelled from the surface of the target spot 4 in random direction, where the target spot 4 can be considered a point source (see FIG. 1B).

A dividing plane 12, which is perpendicular to the direction of rotation R of the velocity filter 6 and wherein the target spot 4 coincides with the dividing plane 12, divides the space between the substrate 1 and the target 3 in an upstream part U and a downstream part D.

Because the velocity filter 6 rotates, the filter passage opening 7 moves away from the target spot 4, such that particles 11 having a direction into the upstream part U will encounter the velocity filter 6 sooner, than the particles 11 having a direction into the downstream part D (i.e. particles 11 having a directional component in the direction of rotation R of the velocity filter 6).

The plasma passage opening 9 has an upstream section 13 which is larger than the downstream section 14. Due to the smaller downstream section 14, part of the plasma plume 10 will deposit onto the plasma hole plate 8 and will be lost, while the remaining part of the plasma plume 10 passes the upstream section 13 and will be deposited on the substrate surface 2.

When more time passes, the velocity filter 6 will have rotated further, such that the filter passage opening 7 has fully passed beyond the dividing plane 12. Any particles 11 having a direction towards the upstream part U will be caught by the velocity filter 6, while some of the particles 11 having a direction towards the downstream part D could pass through the filter passage opening 7 but will be caught by the plasma hole plate 8 (see FIG. 1C).

After the emission of particles 11 from the target spot 4 has stopped, the velocity filter 6 will have rotated even further and has caught a large part of the particles 11. The particles 11 with a direction towards the downstream part and which managed to pass the filter passage opening 7 will have been caught by the plasma hole plate 8. The plasma plume 10 will have formed a deposit layer of target material onto the substrate surface 2 (see FIG. 1D).

Thus, by reducing the plasma passage opening 9 on the downstream part D, particles 11 managing to pass the filter passage opening 7 will still be filtered by the plasma hole plate 8. This reduces the contamination by particles 11 of the substrate surface 11 and the layer of target material deposited thereon.

Figure 2D:
Figure 2E:
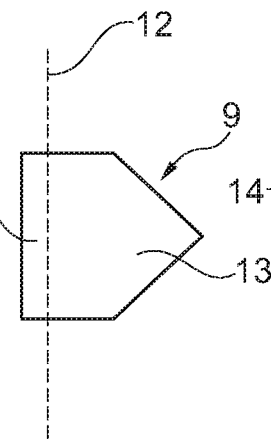
Figure 2F:
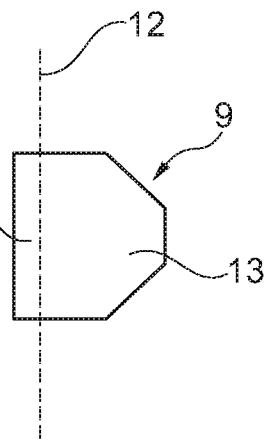
Figure 2G:
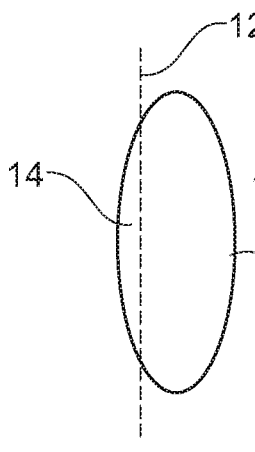
Figure 2H:
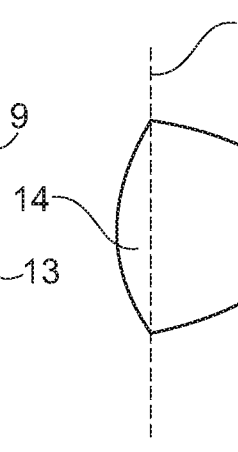
Figure 2I:
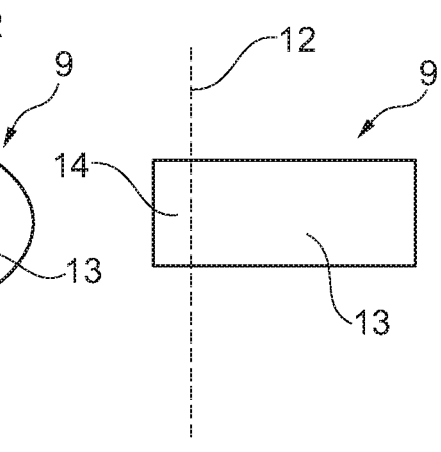

FIGS. 2A-2I show different shapes for the plasma passage opening 9 in the plasma hole plate 8 of the device according to FIG. 1. Clearly each plasma passage opening 9 has an upstream section 13 with a larger surface than the downstream section 14. In FIG. 2D even a shape is proposed, where the downstream section 14 has a surface area of zero.

It will be clear that the shape of the plasma passage opening 9 can be determined by a person skilled in the art merely based on an optimization of for example filtering action of the plasma hole plate 8 and the reduction of the depositing rate by the plasma hole plate 8.

FIG. 3A shows a second embodiment of a device according to the invention. A substrate 21 with a substrate surface 22 is arranged in a substrate holder (not shown). A target 23 is provided opposite of the substrate 21. A target spot 24 is irradiated by a pulsed laser 25 such that a plasma plume 30 is generated.

Furthermore, a velocity filter 26 with a filter passage opening 27 is rotated in the direction R between the substrate 21 and target 23.

Also a plasma hole plate 28 with a plasma passage opening 29 is arranged between the substrate 21 and the velocity filter 26. In this embodiment the plasma hole plate 28 is also rotated but in direction O opposite of the direction R of the velocity filter 26. The plasma passage opening 29 can be symmetrical, for example circular.

As shown in FIG. 3A, the pulsed laser 25 generate a plasma plume 30 when the filter passage opening 26 and plasma passage opening 29 align over the target spot 24.

A dividing plane 32, which is perpendicular to the direction of rotation R of the velocity filter 26 and wherein the target spot 24 coincides with the dividing plane 32, divides the space between the substrate 21 and the target 23 in an upstream part U and a downstream part D.

After the target spot 24 has been irradiated by the laser 25, the plasma plume 30 will leave the target 23 towards the substrate 21 via the filter passage opening 27 and the plasma passage opening 29. The plasma plume 30 will be trailed by undesired particles 31.

As the velocity filter 26 rotates further in the direction R, the filter passage opening 27 will no longer be aligned over the target spot, which is the point source of the particles 31, such that particles 31 directed towards the upstream part U will be caught by the velocity filter 26.

At the same time, the plasma hole plate 28 will have rotated in the opposite direction O, such that the plasma passage opening 29 has, relative to the dividing plane 32, an upstream section 33 with a larger surface area than the surface area of the downstream section 34. Although the reduced size of the downstream section 34 cuts of part of the plasma plume 30, it will also reduce the possibility of particles 31 passing through the plasma passage opening 29 and contaminating the substrate surface 22 (see FIG. 3B).

In FIG. 3C the velocity filter 26 has rotated further, such that the filter passage opening 27 has fully past the dividing plane 32, while the plasma hole plate 28 has rotated further such that the plasma passage opening 29 is also past the dividing plane 32. This ensures that no particles 31 can reach any longer the substrate surface 21 and that all remaining particles 31 are caught by either the velocity filter 26 or the plasma hole plate 28.

FIG. 3D shows the position in which the plasma plume 30 has been deposited onto the substrate 21 and wherein the last particles 31 are caught by the plasma hole plate 28.

The invention claimed is:

1. A device for pulsed laser deposition, comprising:
a substrate holder for holding a substrate;
a target arranged facing a substrate surface of the substrate;
a pulsed laser configured to direct a laser beam onto the target at a target spot for generating a plasma plume of target material, wherein the surface of the target at the target spot faces the substrate surface;
a velocity filter arranged between the substrate and the target, the velocity filter comprising a rotating body with at least one filter passage opening, the rotating body configured to rotate with respect to the target spot; and
a plasma hole plate arranged between the target and the substrate, the plasma hole plate comprising a plasma passage opening that is stationary relative to the target spot during a pulsed laser deposition process, wherein the plasma passage opening is divided in an upstream section and a downstream section by a dividing plane which is perpendicular to the direction of rotation of the velocity filter, wherein the target spot coincides with the dividing plane, wherein the dividing plane is fixed with respect to the target spot and the plasma passage opening, and wherein the upstream section of the plasma passage opening has a larger surface area than the downstream section of the plasma passage opening.

2. The device according to claim 1, wherein a length of the upstream section of the plasma passage opening in the direction of rotation of the velocity filter is larger than the length of the downstream section of the plasma passage opening in the direction of rotation of the velocity filter.

3. The device according to claim 2, wherein the plasma hole plate is arranged between the velocity filter and the substrate.

4. The device according to claim 2, wherein, in use, a part of the generated plasma plume is shielded by the plasma hole plate on the downstream section side of the dividing plane.

5. The device according to claim 2, wherein the surface of the target at the target spot is substantially parallel to the substrate surface.

6. The device according to claim 1, wherein the plasma hole plate is arranged between the velocity filter and the substrate.

7. The device according to claim 6, wherein, in use, a part of the generated plasma plume is shielded by the plasma hole plate on the downstream section side of the dividing plane.

8. The device according to claim 6, wherein the surface of the target at the target spot is substantially parallel to the substrate surface.

9. The device according to claim 1, wherein, in use, a part of the generated plasma plume is shielded by the plasma hole plate on the downstream section side of the dividing plane.

10. The device according to claim 9, wherein the dividing plane is perpendicular to the surface of the target at the target spot.

11. The device according to claim 9, wherein the surface of the target at the target spot is substantially parallel to the substrate surface.

12. The device according to claim 1, wherein the surface of the target at the target spot is substantially parallel to the substrate surface.

* * * * *